(12) United States Patent
Inoue et al.

(10) Patent No.: US 6,643,345 B1
(45) Date of Patent: Nov. 4, 2003

(54) SYNCHRONOUS CONTROL APPARATUS AND METHOD

(75) Inventors: Kinya Inoue, Hamamatsu (JP); Masafumi Toshitani, Hamamatsu (JP); Hitoshi Koseki, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 09/359,546

(22) Filed: Jul. 22, 1999

(30) Foreign Application Priority Data

Jul. 23, 1998 (JP) .......................................... 10-208139

(51) Int. Cl.[7] .............................................. H04L 29/00
(52) U.S. Cl. ...................................... 375/372; 370/516
(58) Field of Search ........................ 375/372; 370/516; 327/141, 154

(56) References Cited

U.S. PATENT DOCUMENTS

| | | | | |
|---|---|---|---|---|
| 5,339,338 A | * | 8/1994 | Elliott ......................... | 375/372 |
| 5,901,149 A | * | 5/1999 | Itakura et al. ................ | 341/51 |
| 6,088,413 A | * | 7/2000 | Autry et al. ................. | 375/372 |
| 6,111,878 A | * | 8/2000 | Powell ........................ | 370/252 |

FOREIGN PATENT DOCUMENTS

| | | |
|---|---|---|
| JP | 2105272 | 1/1992 |
| JP | 4010712 | 1/1992 |
| JP | 4322532 | 12/1992 |

OTHER PUBLICATIONS

*English language Abstract.

* cited by examiner

Primary Examiner—Amanda T. Le
(74) Attorney, Agent, or Firm—Pillsbury Winthrop LLP

(57) ABSTRACT

A digital variable-frequency oscillator has an output frequency thereof variable in dependence upon a frequency control variable. Externally input data are stored in a data storage device, from which the data are generated in accordance with the output of the digital variable-frequency oscillator. A remaining data amount of the data storage device is detected in response to an externally input timing signal that is received in synchronism with the data received by the data storage device such that synchronization is performed based on the timing signal. A filtering operation is performed on values of the frequency control variable so as to calculate an average value of the frequency control variable. A new value of the frequency control variable is calculated based on the calculated average value and the difference between the detected remaining data amount of the data storage device and a target data amount thereof. The output frequency of the digital variable-frequency oscillator is controlled based on the calculated new value of the frequency control variable so as to reduce the difference between the remaining data amount of the data storage device and the target data amount thereof.

20 Claims, 17 Drawing Sheets

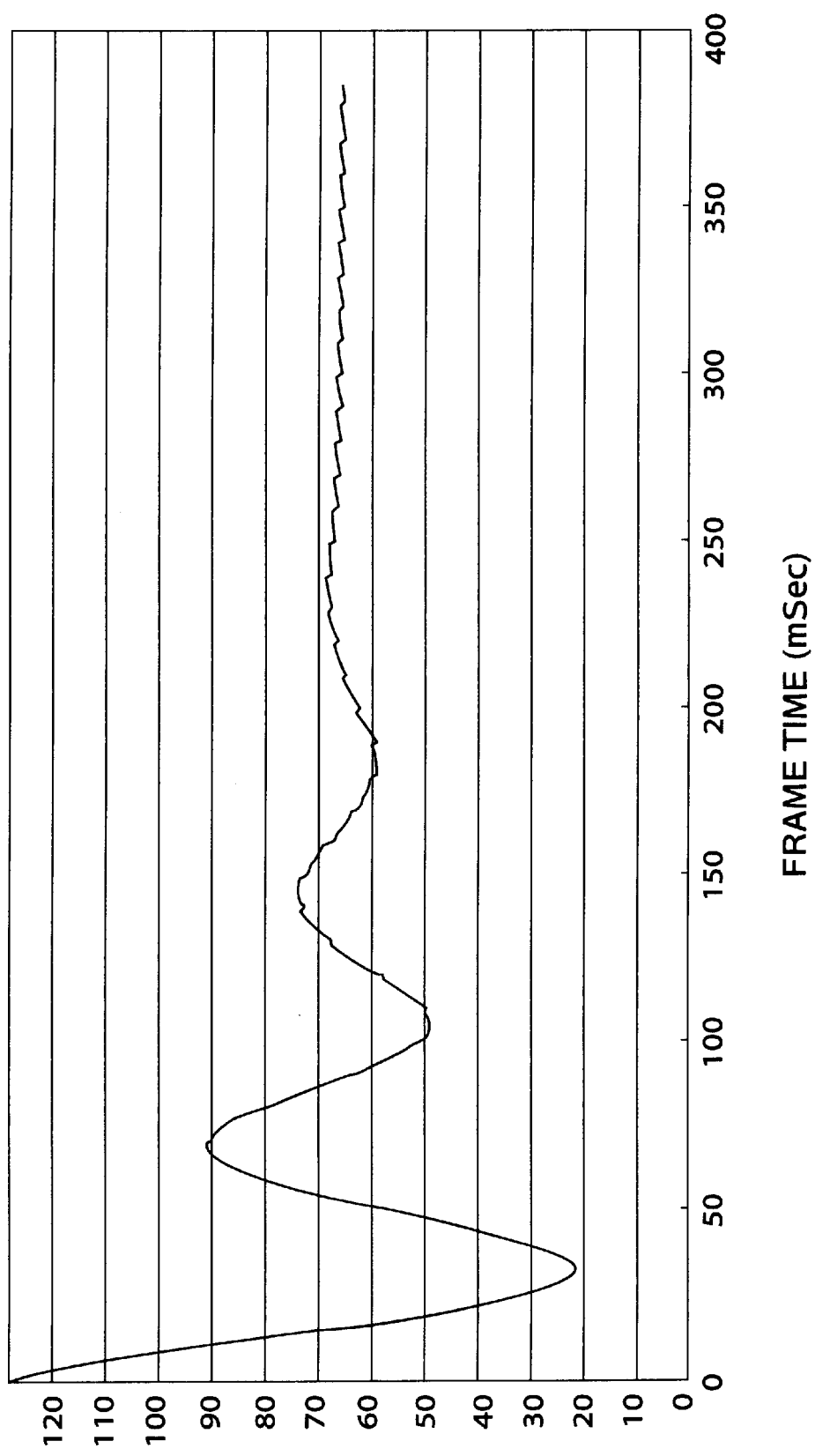

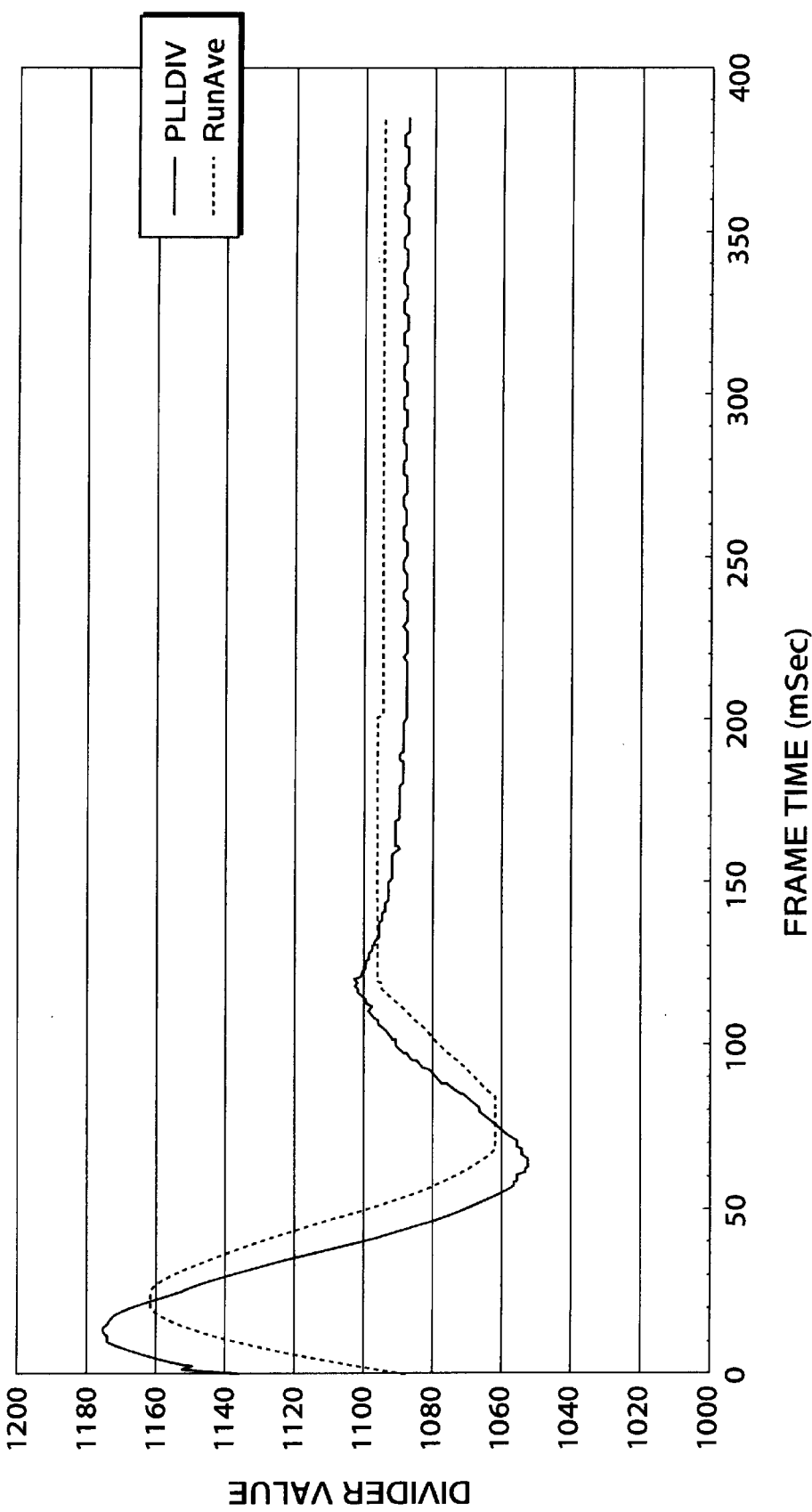

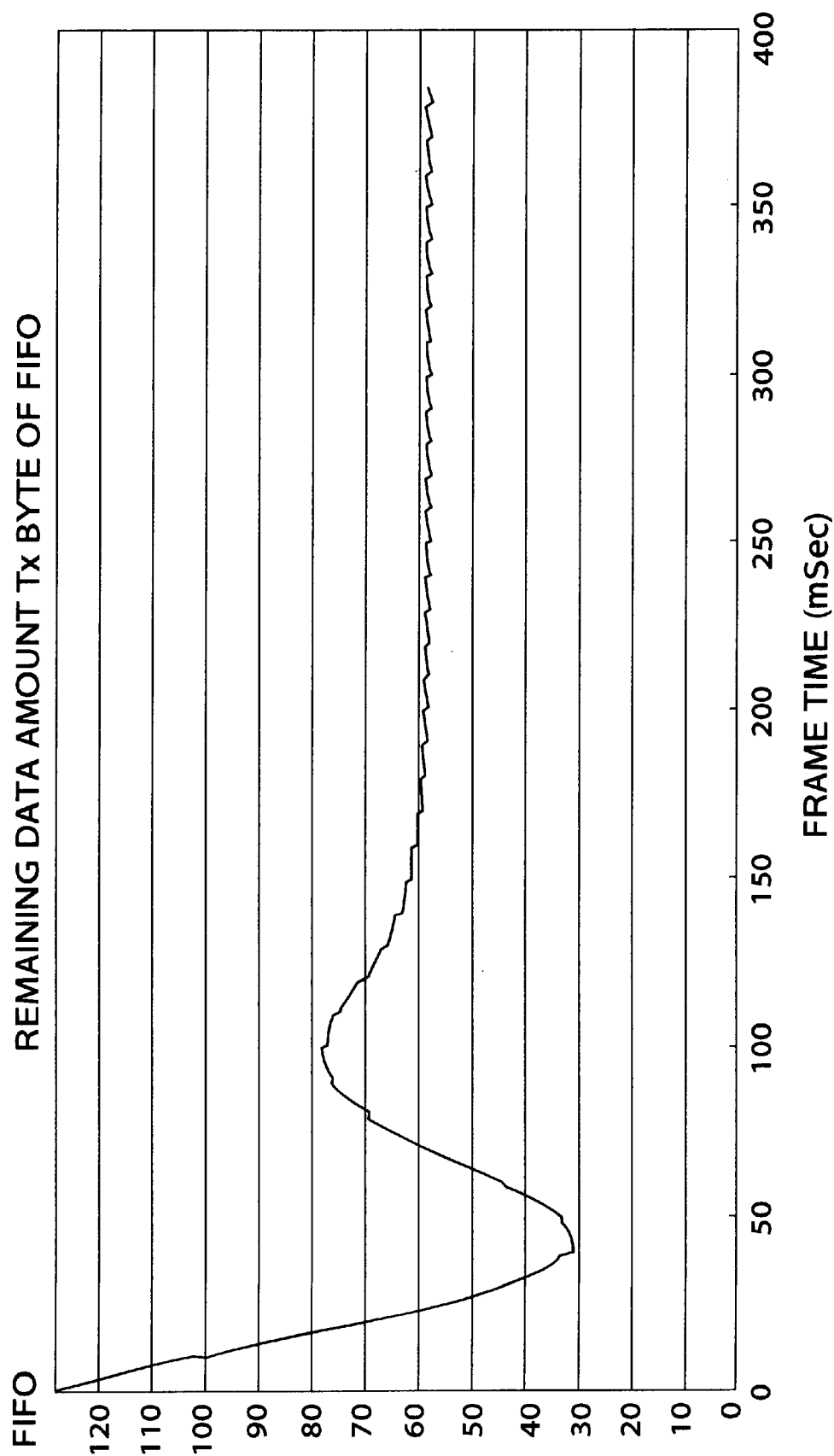

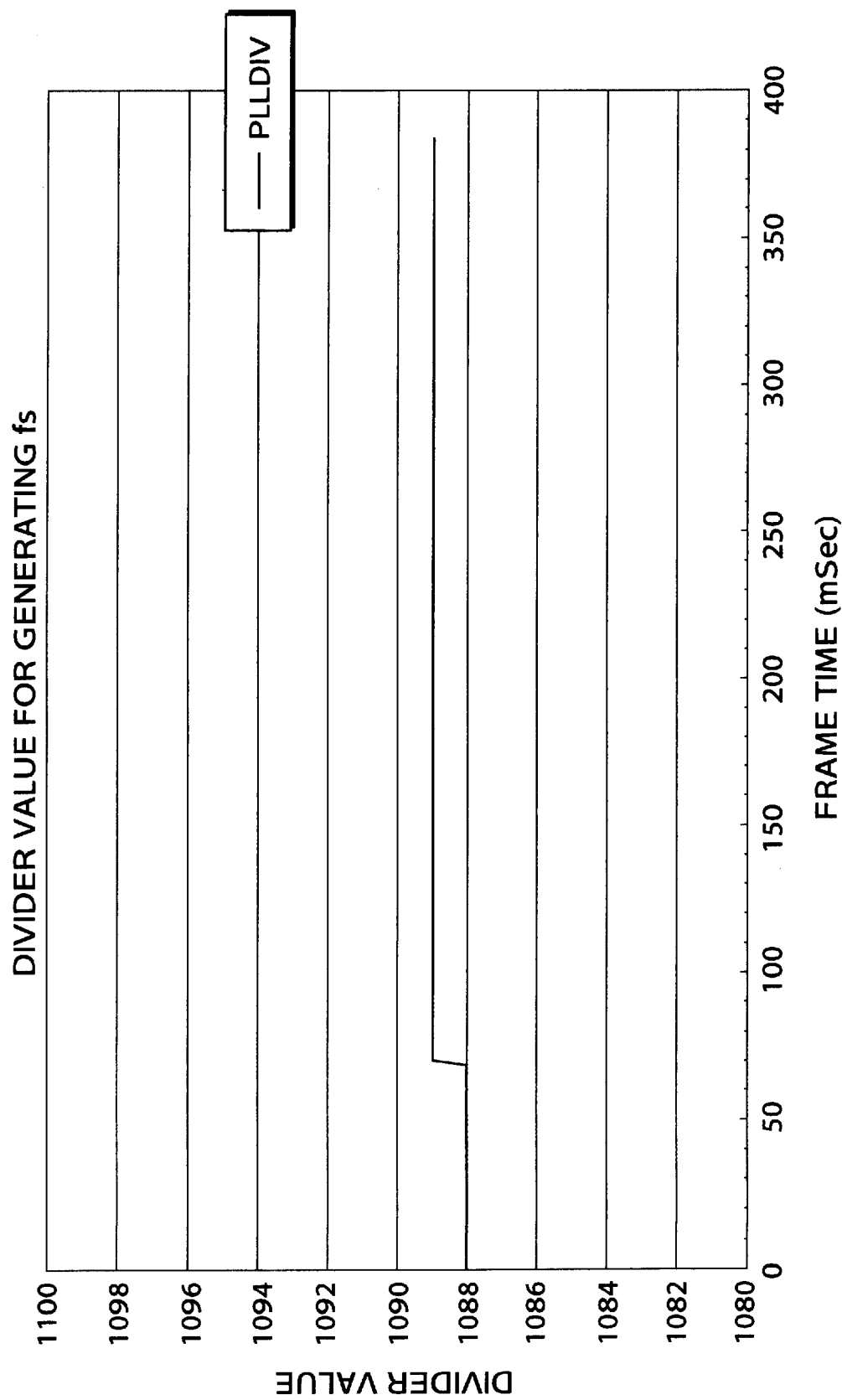

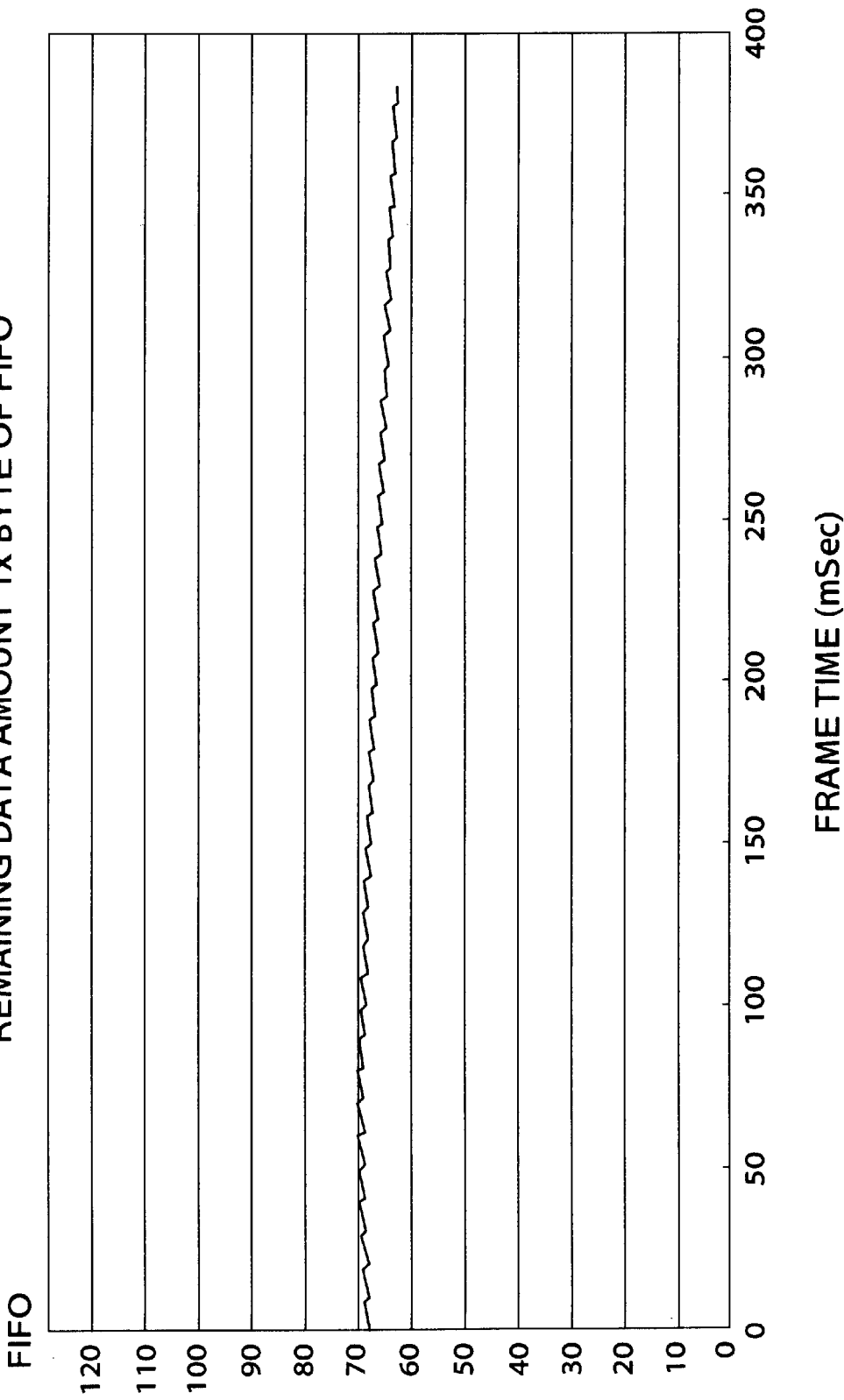

SYNCHRONOUS CONTROL APPARATUS AND METHOD

BACKGROUND OF THE INVENTION

1. Field of the Invention

The present invention relates to synchronous control apparatus and method for generating an output signal of a frequency in synchronism with data received from an external apparatus.

2. Prior Art

Conventionally, a PLL (phase-locked loop) circuit is known as a means for generating an output signal of a frequency in synchronism with an input signal. A general PLL circuit is principally comprised of a phase comparator that compares the phase of the input signal with that of an output signal (such as a reproduced clock signal), a loop filter that smoothes the output of the comparator, and a VCO (voltage-controlled oscillator) that generates a reproduced clock signal whose frequency varies depending upon the output of the loop filter. In the case where a sampling clock signal of 44.1 kHz is reproduced from an input signal of 1 kHz so that the sampling clock signal is in phase with the input signal, for example, a frequency divider circuit needs to be provided in a feedback path leading to the phase comparator, for reducing the frequency (44 kHz) of the sampling clock signal to be reproduced, down to 1 kHz.

In the conventional PLL circuit, however, all of its components or elements must be physically constructed using hardware, and therefore the number of components used in the circuit increases particularly with an increase in the number of stages of the frequency divider (frequency divider ratio), resulting in a rather complicated circuit configuration. Also, a pull-in response (response to an input signal) of the conventional PLL circuit depends upon the time constant of the loop filter, and, since the time constant cannot be easily changed, it takes time to pull in or capture the input signal (i.e., input signal processing) if the frequency of the input signal is largely different from that of the output signal. Furthermore, since circuit components are built in the conventional (PLL) circuit assuming a particular input/output frequency ratio, the PLL circuit is unable to flexibly deal with input and output signals having different frequency ratios.

SUMMARY OF THE INVENTION

It is therefore a first object of the present invention to provide a synchronous control apparatus which has a simple circuit configuration and ensures a sufficiently high pull-in speed, and which is able to flexibly handle input and output signals having different frequency ratios.

It is a second object to provide such a synchronous control method.

To attain the first object, the present invention provides a synchronous control apparatus comprising a digital variable-frequency oscillator having an output frequency thereof variable in dependence upon a frequency control variable, a data storage device that stores externally input data, and generates the data in accordance with an output of the digital variable-frequency oscillator, and a control device that controls the output frequency of the digital variable-frequency oscillator, by detecting a remaining data amount of the data storage device in response to an externally input timing signal that is received in synchronism with the data received by the data storage device such that synchronization is performed based on the timing signal, calculating a new value of the frequency control variable based on a difference between the detected remaining data amount of the data storage device and a target data amount thereof, and controlling the output frequency of the digital variable-frequency oscillator based on the calculated new value of the frequency control variable so as to reduce a difference between the remaining data amount of the data storage device and the target data amount thereof.

In a preferred form of the invention, the synchronous control apparatus comprises a digital variable-frequency oscillator having an output frequency thereof variable in dependence upon a frequency control variable, a data storage device that stores externally input data, and generates the data in accordance with an output of the digital variable-frequency oscillator, and a control device that controls the output frequency of the digital variable-frequency oscillator, by detecting a remaining data amount of the data storage device in response to an externally input timing signal that is received in synchronism with the data received by the data storage device such that synchronization is performed based on the timing signal, performing a filtering operation on values of the frequency control variable so as to calculate an average value of the frequency control variable, calculating a new value of the frequency control variable based on the calculated average value and a difference between the detected remaining data amount of the data storage device and a target data amount thereof, and controlling the output frequency of the digital variable-frequency oscillator based on the calculated new value of the frequency control variable so as to reduce a difference between the remaining data amount of the data storage device and the target data amount thereof.

Preferably, the control device performs the filtering operation on a difference between a previous value of the frequency control variable and a previous average value of the frequency control variable, so as to calculate a current average value of the frequency control variable, and calculates the new value of the frequency control variable based on the current average value and the difference between the detected remaining data amount and the target data amount.

Also preferably, the control device determines an output value based on a curve of at least the second order from the difference between the detected remaining data amount of the data storage device and the target data amount, and calculates the new value of the frequency control variable based on the calculated average value of the frequency control variable and the determined output value.

More preferably, the control device includes an inhibiting device that inhibits the frequency control variable from being changed when the difference between the detected remaining data amount of the data storage device and the target data amount is within a predetermined permissible fluctuation range while the synchronous control circuit is in a locked state.

Preferably, the target data amount is set to one half of a capacity of the data storage device.

To attain the second object, the present invention provides a synchronous control method comprising the steps of generating a sampling signal having a frequency thereof variable in dependence upon a frequency control variable, storing externally input data in a data storage device, and generating the data in accordance with the sampling signal, detecting a remaining data amount of the data storage device in response to an externally input timing signal that is received in synchronism with the data received by the data storage device such that synchronization is performed based on the timing signal, calculating a new value of the frequency control variable based on a difference between the detected remaining data amount of the data storage device and a target data amount thereof, and controlling the frequency of the sampling signal based on the calculated new value of the frequency control variable so as to reduce a difference between the remaining data amount of the data storage device and the target data amount thereof.

In a preferred form of the invention, the synchronous control method comprises the steps of generating a sampling signal having a frequency thereof variable in dependence upon a frequency control variable, storing externally input data in a data storage device, and generating the data in accordance with the sampling signal, detecting a remaining data amount of the data storage device in response to an externally input timing signal that is received in synchronism with the data received by the data storage device such that synchronization is performed based on the timing signal, performing a filtering operation on values of the frequency control variable so as to calculate an average value of the frequency control variable, calculating a new value of the frequency control variable based on the calculated average value and a difference between the detected remaining data amount of the data storage device and a target data amount thereof, and controlling the frequency of the sampling signal based on the calculated new value of the frequency control variable so as to reduce a difference between the remaining data amount of the data storage device and the target data amount thereof.

In the synchronous control apparatus and method of the present invention constructed as described above, while the data storage device outputs data in accordance with the output of the digital variable-frequency oscillator, the control device checks the amount of data remaining in the storage device upon an input of each pulse of the externally input timing signal based on which synchronizing operations are performed. The control device calculates a new value of the frequency control variable, depending upon which the output frequency of the digital variable-frequency oscillator is variable, based upon a difference between the checked or detected remaining data amount of the data storage device and a target data amount. Preferably, after performing a filtering operation on values of the frequency control variable, so as to obtain an average value of the frequency control variable, a new value of the frequency control variable is calculated based on the calculated average value and a difference between the checked or detected remaining data amount of the data storage device and a target data amount. Based on the thus calculated frequency control variable, the control device controls the output frequency of the digital variable-frequency oscillator so as to reduce or minimize the difference between the remaining data amount of the data storage device and the target data amount.

According to the present invention, therefore, checking or detecting of the remaining data amount, calculation of the difference between the detected remaining data amount and the target data amount, filtering operation, and calculation of the control variable of the digital variable-frequency oscillator can be all realized by software, and thus the required number of components can be significantly reduced. Also, a variation or deviation in the output frequency of the digital variable-frequency oscillator in either positive or negative direction can be directly obtained based on the difference between the remaining data amount and the target data amount, thus permitting the apparatus to accomplish a quick frequency pull-in operation in order to absorb or minimize the deviation. Furthermore, according to the present invention, the filtering operation is performed for calculation of the frequency control variable, which is advantageous in terms of stabilization of the circuit system.

Further, the value of the frequency control variable may be calculated based on a curve of the second or higher order that represents a relationship of the frequency control variable with the difference between the remaining data amount and the target data amount. In this case, the pull-in response speed (response to the input signal) is further improved. Also, the control device is preferably inhibited from changing the value of the frequency control variable when the difference between the remaining data amount and the target data amount is within a predetermined permissible fluctuation range. With this arrangement, varying frequency components due to jitter of the input data can be driven away into a low frequency region outside the audible frequency band, assuring improved audio characteristics.

The above and other objects, features, and advantages of the invention will become more apparent from the following detailed description taken in conjunction with the accompanying drawings.

BRIEF DESCRIPTION OF THE DRAWINGS

FIGS. 8A and 8B are graphs useful in explaining the effect of the routine of FIG. 6;

FIGS. 9A and 9B are graphs useful in explaining the effect of the routine of FIG. 6;

FIGS. 10A and 10B are graphs useful in explaining the effect of the routine of FIG. 6, wherein FIG. 10A shows divider values used when generating a sampling signal, with respect to the frame time, and FIG. 10B shows the remaining data amount TxByte of the FIFO, with respect to the frame time;

FIGS. 13A and 13B are graphs useful in explaining the effect of the routine of FIG. 12, wherein FIG. 13A shows divider values used when generating a sampling signal, with respect to the frame time, and FIG. 13B shows the remaining data amount TxByte of the FIFO, with respect to the frame time; and FIGS. 14A and 14B are graphs useful in explaining the effect of the routine of FIG. 12, wherein FIG. 14A shows divider values used when generating a sampling signal, with respect to the frame time, and FIG. 14B shows the remaining data amount TxByte of the FIFO, with respect to the frame time.

DETAILED DESCRIPTION OF THE PREFERRED EMBODIMENT

The present invention will be described in detail with reference to the accompanying drawings showing a preferred embodiment thereof.

Figure 1:
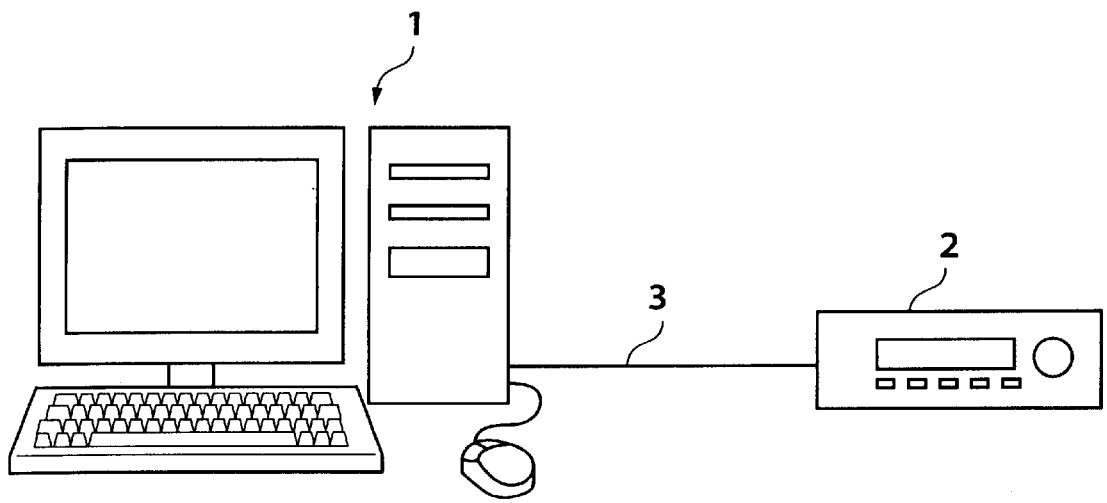
FIG. 1 is a view showing a system that includes a synchronous control circuit constructed according to one embodiment of the present invention.

FIG. 1 illustrates one example of systems that employs a synchronous control circuit constructed according to one embodiment of the present invention. The synchronous control circuit of the present embodiment takes the form of a PLL circuit.

The system of FIG. 1 includes a host computer 1 that supplies a timing signal based on which synchronizing operations are performed, and an object apparatus 2 that operates in synchronism with output data received from the host computer 1. The host computer 1 and the object apparatus 2 are connected to each other via a signal cable 3, such as a USB (Universal Serial Bus). The object apparatus 2 to be synchronized may be a simplified audio equipment, or the like, that receives musical data from the host computer 1, and generates musical tones in accordance with the musical data. The synchronous control circuit of the present invention is incorporated in the object apparatus 2.

Figure 2:
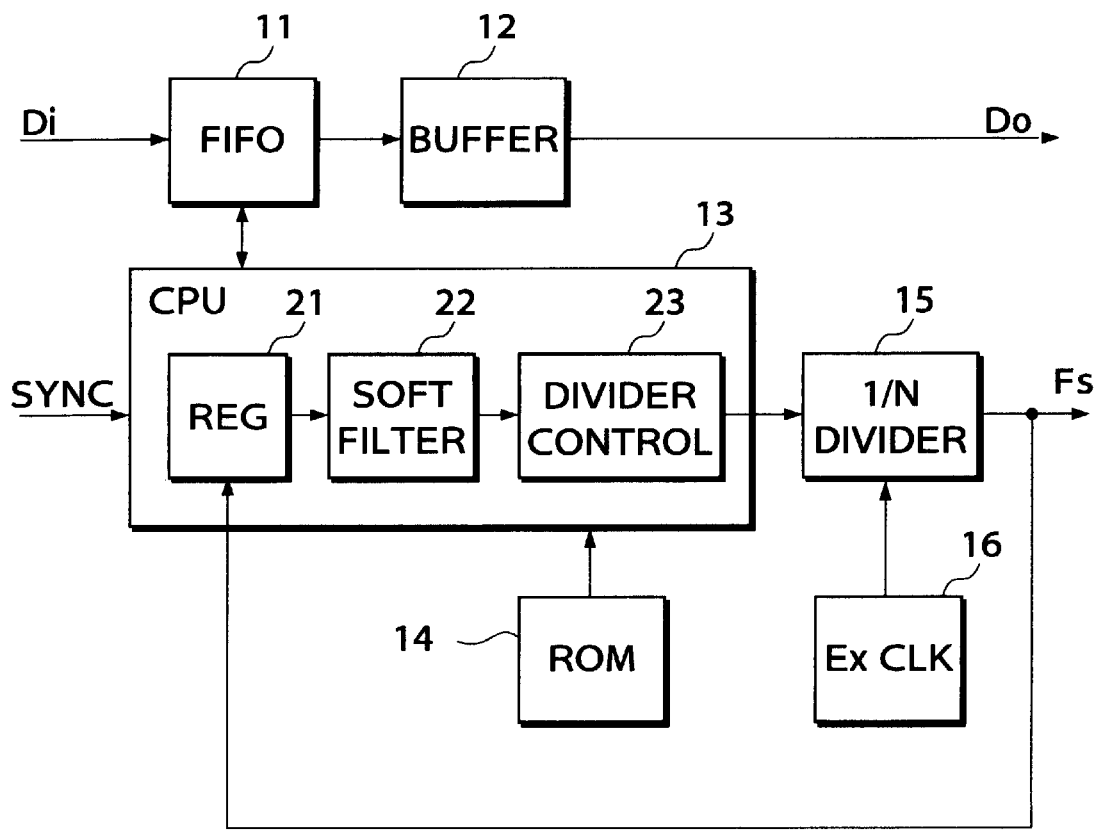
FIG. 2 is a block diagram showing the configuration of the synchronous control circuit of FIG. 1.

FIG. 2 shows the configuration of the synchronous control circuit of the present embodiment.

The synchronous control circuit of FIG. 2 includes a FIFO (First In First Out) 11 and a buffer 12 that serve as data storage means, a CPU 13 that serves as control means, a ROM 14, a 1/N divider (frequency divider circuit) 15 that serves as a digital variable-frequency oscillator, and an external locked oscillator 16.

Figure 3:
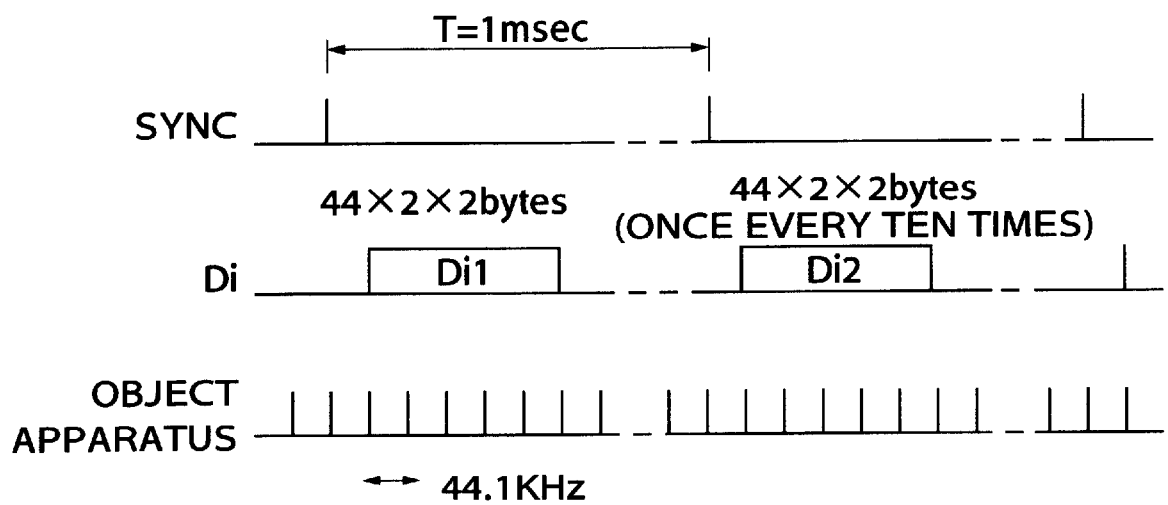
FIG. 3 is a timing chart showing input data and a SYNC signal received by the synchronous control circuit of FIG. 2.

FIG. 3 shows input data Di and SYNC signal to be supplied to the circuit of FIG. 2. The SYNC signal serves as a timing signal based on which synchronizing operations are performed. In this connection, a synchronous signal that is equivalent to the SYNC signal is called "SOF (Start of Frame) signal" according to the USB standard, and the host computer 1 generates pulses of the synchronous signal at fixed time intervals (period: T=1 msec). The input data Di received in bursts following the SYNC signal may be 44.1 kHz, 16-bit stereo audio data, for example. In this case, only 44×2×2 bytes (or 45×2×2 bytes once every ten times) of the input data Di are transmitted in one period (1 msec) of the SYNC signal. Thus, the overall data-flow rate turns out to be equal to that of the 44.1 kHz, 16-bit data.

Three types of synchronization modes or methods as follows may be considered where the USB is used as the signal cable 3.

(1) Asynchronous Mode

The host computer 1 and object apparatus 2 operate with asynchronous clock signals, and data transmission of the host computer 1 is synchronized utilizing feedback from the object apparatus 2.

(2) Synchronous Mode

The host computer 1 transmits data to the object apparatus 2 at a frequency of descriptor, and the operation of the object apparatus 2 is locked to the frequency of the SYNC signal (SOF signal). In other words, the object apparatus 2 operates at a fixed frequency of the SYNC signal

(3) Adaptive Mode

While data is basically transmitted from the host computer 1 to the object apparatus 2 at a frequency of descriptor, the operation of the object apparatus 2 is locked to the rate of data flow from the host computer 1.

In the asynchronous mode (1) as described above, a serious burden is imposed on the host computer 1, and data corruption may occur if a plurality of object apparatuses 2 are connected to the host computer 1. In the synchronous mode (2) as described above, the object apparatus 2 operates at a fixed frequency of the SYNC signal (i.e., the operation of the apparatus 2 is locked to the SYNC signal), but does not operate in synchronism with the rate of the data flow. Accordingly, data corruption may occur in the case where the data flow is not completely locked to the SYNC signal, or where the frequency or data-flow rate varies. In the above-described system in which data of 45×2×2 bytes is fed to the object apparatus 2 once every ten times, there arises a need to lock a reproduction clock signal to a relatively low frequency, which requires a large-sized frequency divider circuit, resulting in reduced stability of the system. In view of these problems, the system of FIG. 1 employs the adaptive mode (3) that does not cause data corruption.

The input burst data Di that follows the SYNC signal is stored in the FIFO 11, and then generated as output data Do via the buffer 12 under control of the CPU 13. The CPU 13 incorporates a set of registers 21 for storing various monitored values, and operates to check the amount of data remaining in the FIFO 11 as a monitored amount, based on a pointer stored in the register set 21, each time a pulse of the SYNC signal for initiating an interrupt routine is received from the outside of the circuit at time intervals (period) of T, according to a microprogram stored in the ROM 14. The CPU 13 also includes a software filter portion 22 and a divider control portion 23 that are realized functionally (i.e. through software). The software filter portion 22 performs a certain filtering operation on divider values (divider ratios) of the 1/N divider 15 and calculates a running average value of the divider values, and the divider control portion 23 calculates a divider value based on the running average value and a difference between the above-indicated remaining amount of data in the FIFO and a target value of the remaining amount, and controls the 1/N divider 15 based on the obtained divider value. The 1/N divider 15 divides an output clock signal of the external locked oscillator 16 based on the divider value supplied from the divider control portion 23, and generates an output sampling signal Fs in synchronism with the output data Do. The output sampling signal Fs is then transmitted to a circuit connected to the output of the circuit, for example, a D/A converter for performing D/A conversion on the output data, and also supplied to the CPU 13 for use in updating a read pointer of the FIFO 11.

Figure 4:
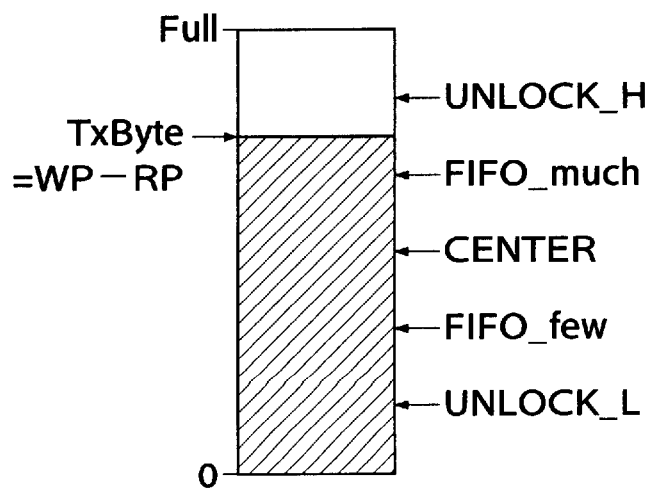
FIG. 4 is a view showing the relationship between the remaining amount of data in a FIFO of the synchronous control circuit and various preset values.

FIG. 4 shows the amount of data remaining in the FIFO 11 and various preset values. In FIG. 4, WP and RP represent a write pointer and a read pointer of the FIFO 11, respectively, and TxByte represents the remaining amount (WP−RP) of data in the FIFO 11. In order that the FIFO memory is used with the maximum efficiency, the system of the present embodiment controls the remaining amount TxByte of data in the FIFO 11 so that the remaining data amount coincides with one half of the capacity (rated capacity) of the FIFO 11, i.e., the middle value "CENTER"

(target remaining amount) as shown in FIG. 4. In addition, certain values FIFO_much, UNLOCK_H. and FIFO_few and UNLOCK_L are preset above and below the middle value CENTER, respectively, and the remaining amount of data in the FIFO 11 is set to be within a permissible fluctuation range as described later, which is defined between the values FIFO_much, FIFO_few out of the above preset values.

Figure 5:
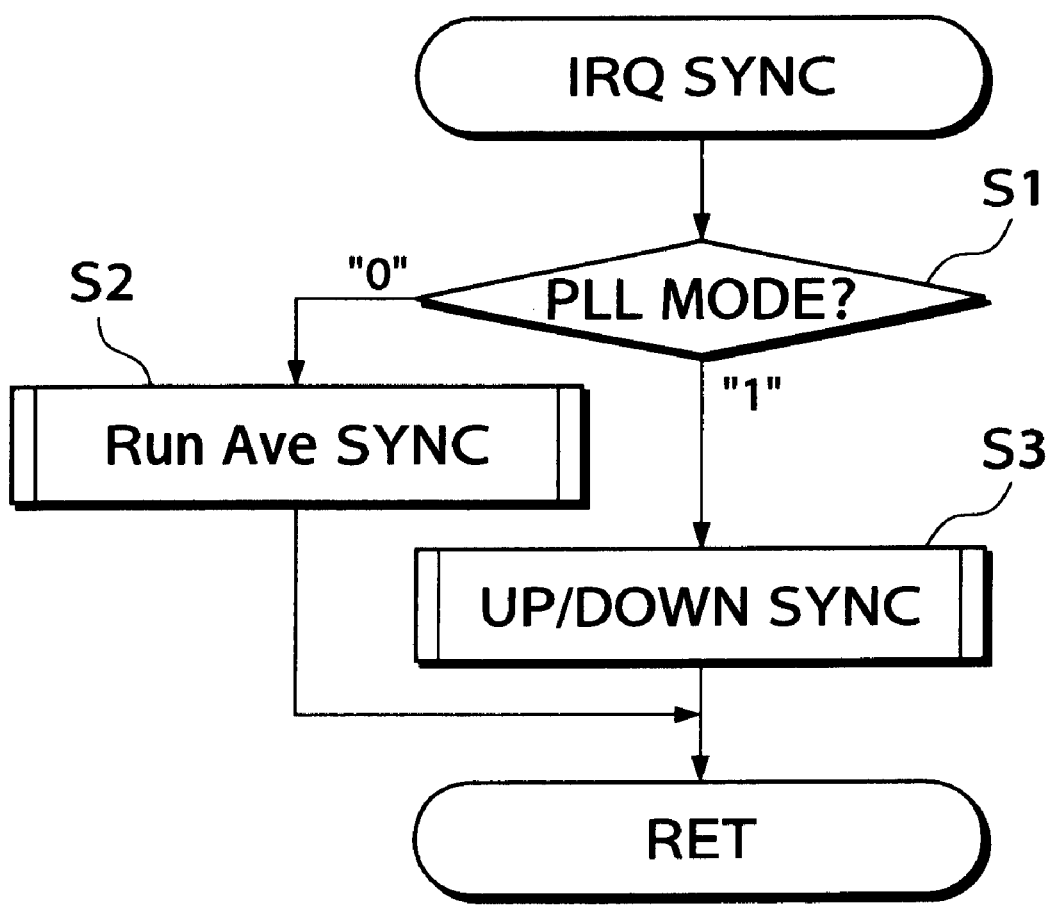
FIG. 5 is a flowchart showing an interrupt routine executed when the synchronous control circuit receives the SYNC signal.

FIG. 5 shows an interrupt routine (synchronizing operation) that is executed when the CPU 13 receives each pulse of the SYNC signal.

The system of the present embodiment performs a synchronizing operation in a selected one of two modes, i.e., "Run Ave SYNC" mode and "UP/DOWN SYNC" mode. In the "Run Ave SYNC" mode in which the synchronizing operation is performed until the PLL circuit becomes locked, the 1/N divider 15 is controlled upon input of each pulse of the SYNC signal so that the remaining amount of data TxByte in the FIFO 11 is constantly equal to one half of the full capacity of the FIFO 11, while at the same time a feedback system operates with a delay using the running average value, so as to suppress oscillation of the system. In the "UP/DOWN SYNC" mode in which the synchronizing operation is performed after the PLL circuit has been locked, a permissible fluctuation range is established for the remaining amount of data in the FIFO 11. In this mode, if the remaining data amount exceeds the permissible range, the divider value based on the remaining amount is fed to the 1/N divider 15 in a feedback fashion, so that variations in the frequency fs of the output sampling signal Fs are limited to be smaller than the audible frequency band, to thereby suppress distortion.

In the routine of FIG. 5, step S1 is executed upon receipt of the SYNC signal, to check the value of a PLL mode flag in the register set 21 so as to determine whether the PLL circuit is in an unlocked state ("0") or locked state ("1"). If step S1 determines that the value of the PLL mode flag is "0", step S2 is executed to establish the "Run Ave SYNC" mode as described above, to perform a synchronizing operation in this mode. If step S1 determines that the value of the PLL mode flag is "1", step S3 is executed to establish the "UP/DOWN SYNC" mode as described above, to perform a synchronizing operation in this mode.

Figure 6:
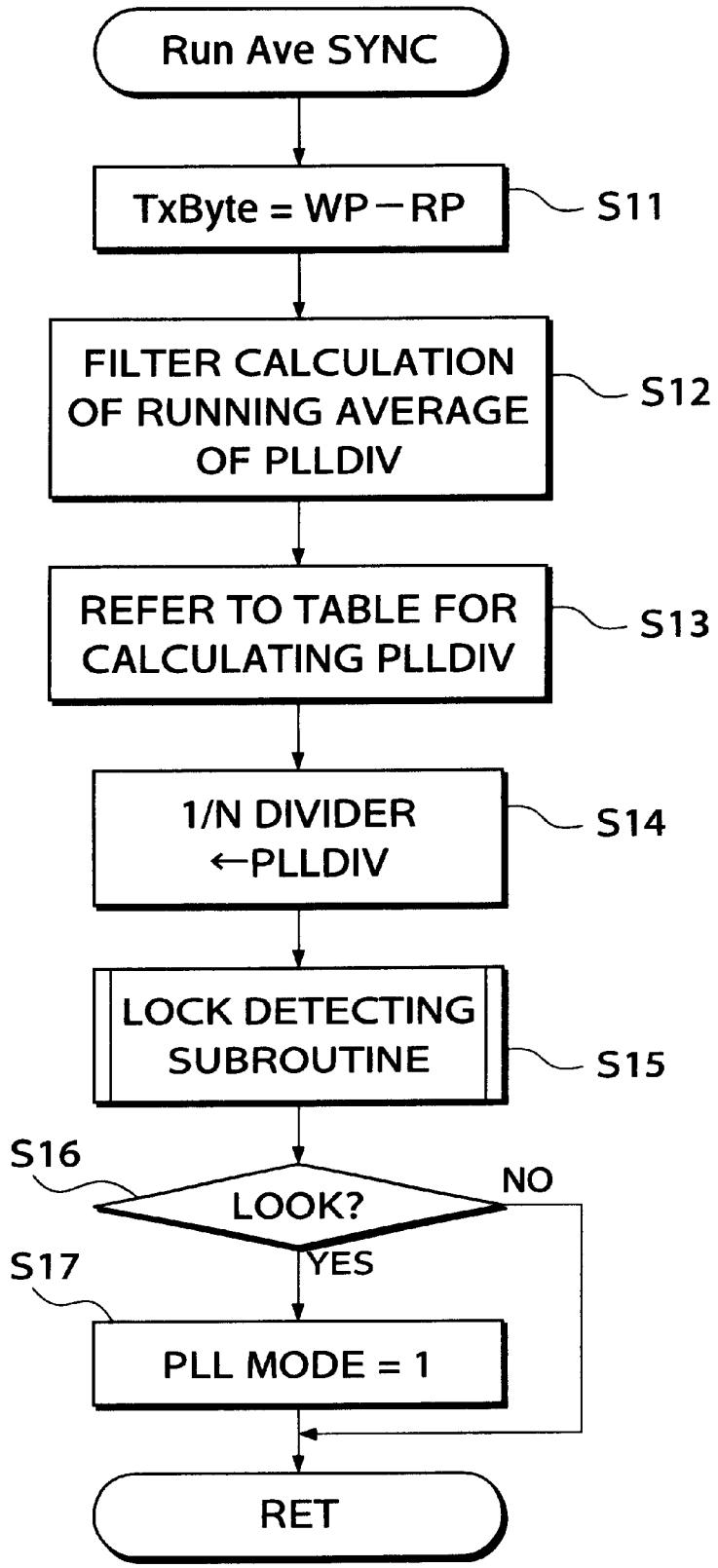
FIG. 6 is a flowchart showing a synchronizing operation performed in a "Run Ave SYNC" mode in step S2 of the routine of FIG. 5.

FIG. 6 shows a synchronization operation performed in the "Run Ave SYNC" mode.

Initially, step S11 is executed to obtain the remaining data amount TxByte (=WP−RP) of the FIFO 11. Step S12 is then executed to carry out filter calculation for obtaining a running average value of the divider value PLLDIV to be set in the 1/N divider 15. More specifically, the running average value PLLDIV_av[N] may be calculated according to the expression (1) as follows:

$$\text{PLLDIV\_av}[N] = \text{PLLDIV\_av}[N-1] + (\text{PLLDIV}[N-1] - \text{PLLDIV\_av}[N-1])/\#\text{filter} \quad (1)$$

where PLLDIV_av[N]: the running average value obtained in the current control cycle, PLLDIV_av[N−1]: the running average value obtained in the last cycle, PLLDIV[N−1]: the divider value obtained in the last cycle, and filter: an arbitrary coefficient.

The coefficient #filter corresponds to the time constant of the filter, and the effect of averaging is improved with an increase in the value of the coefficient #filter.

Figure 7:
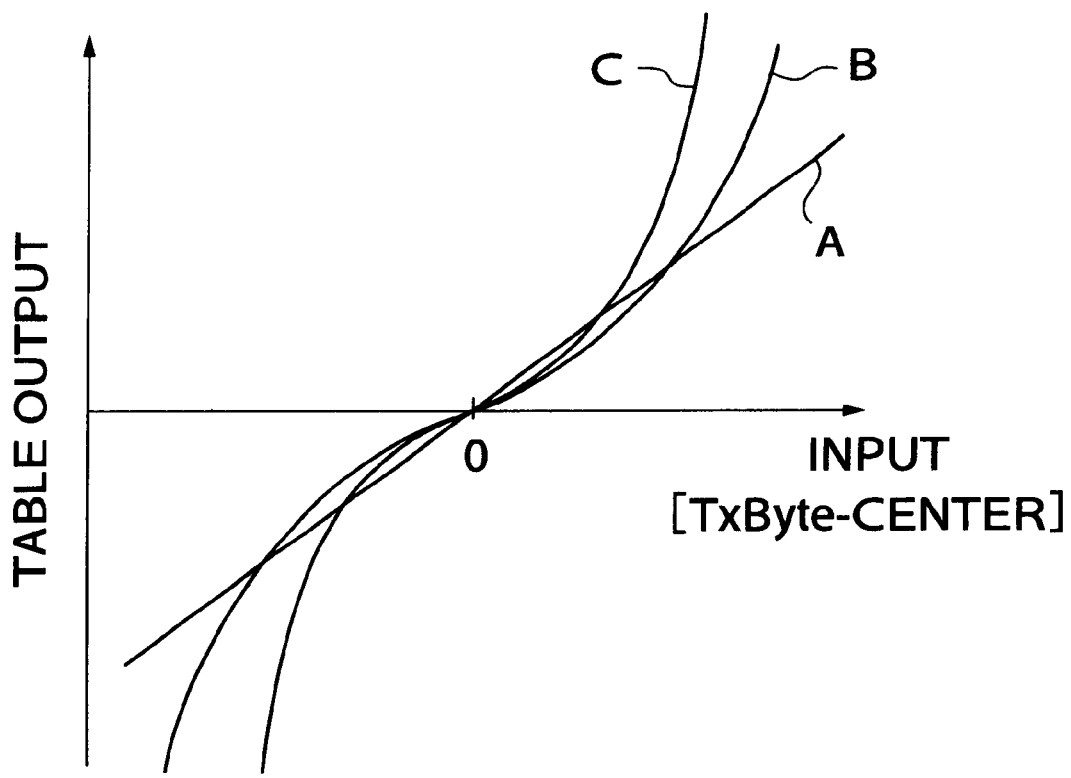
FIG. 7 is a view showing an example of table used in the routine of FIG. 6.
Figure 8A:
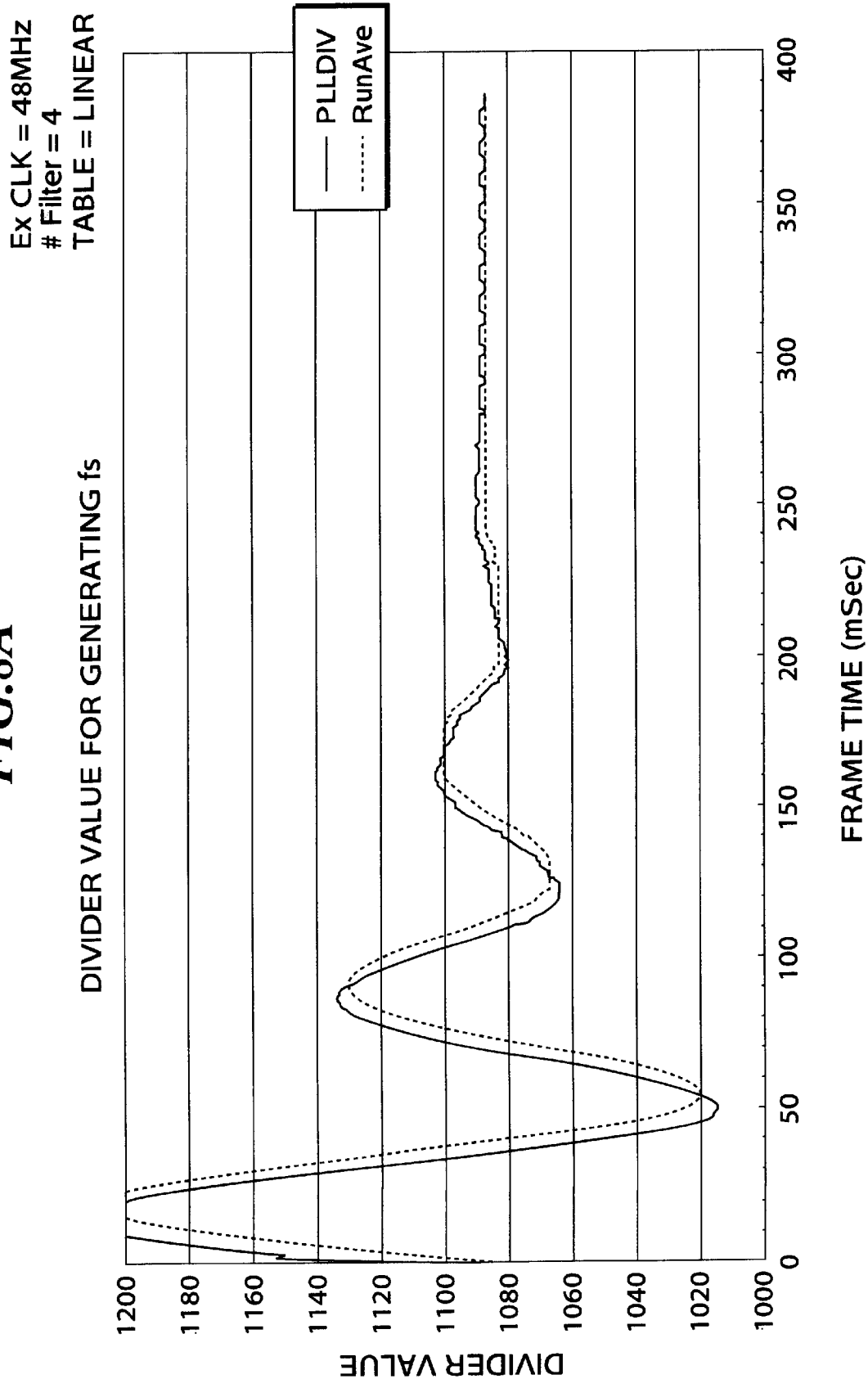
Figure 10A:
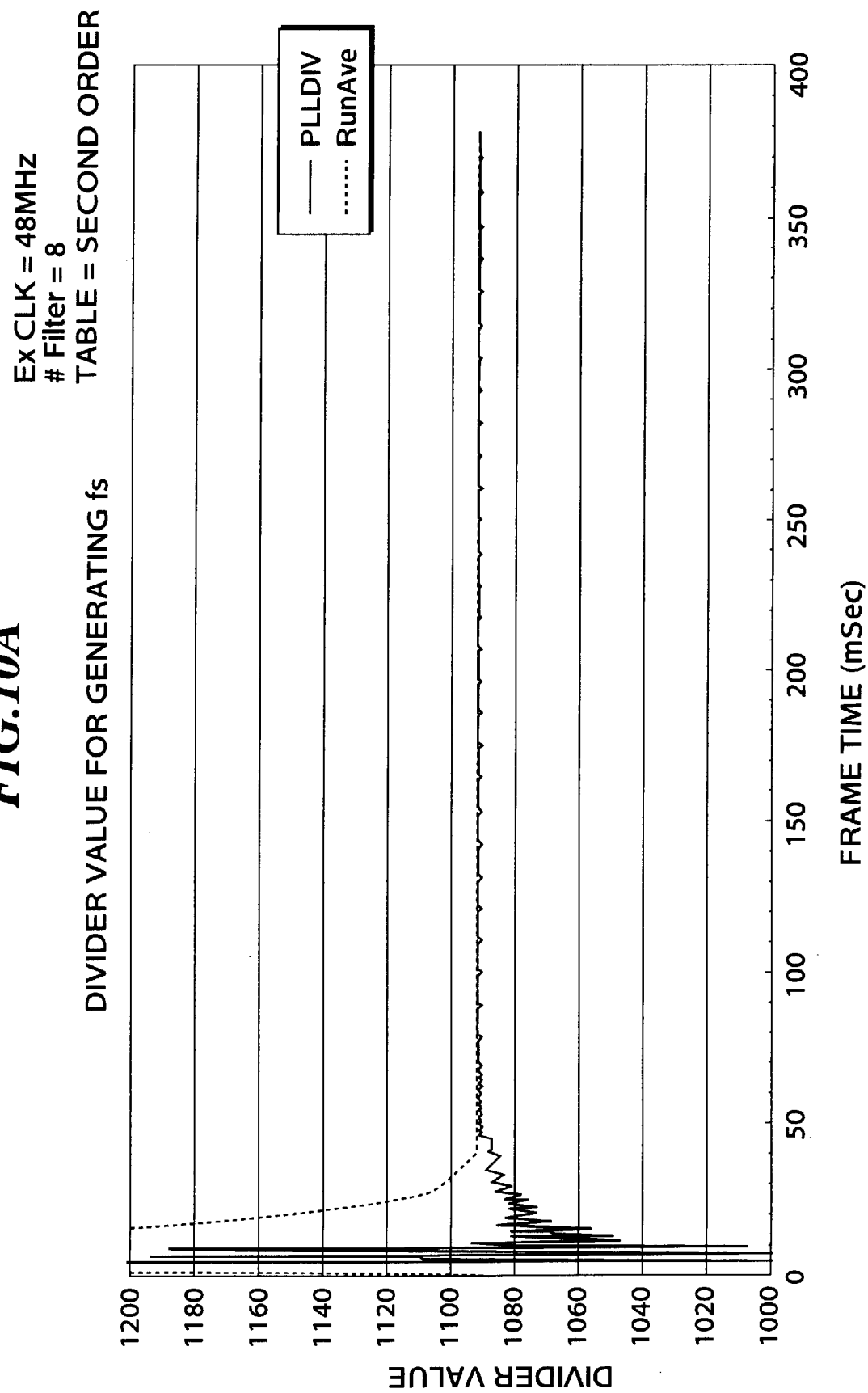
Figure 10B:
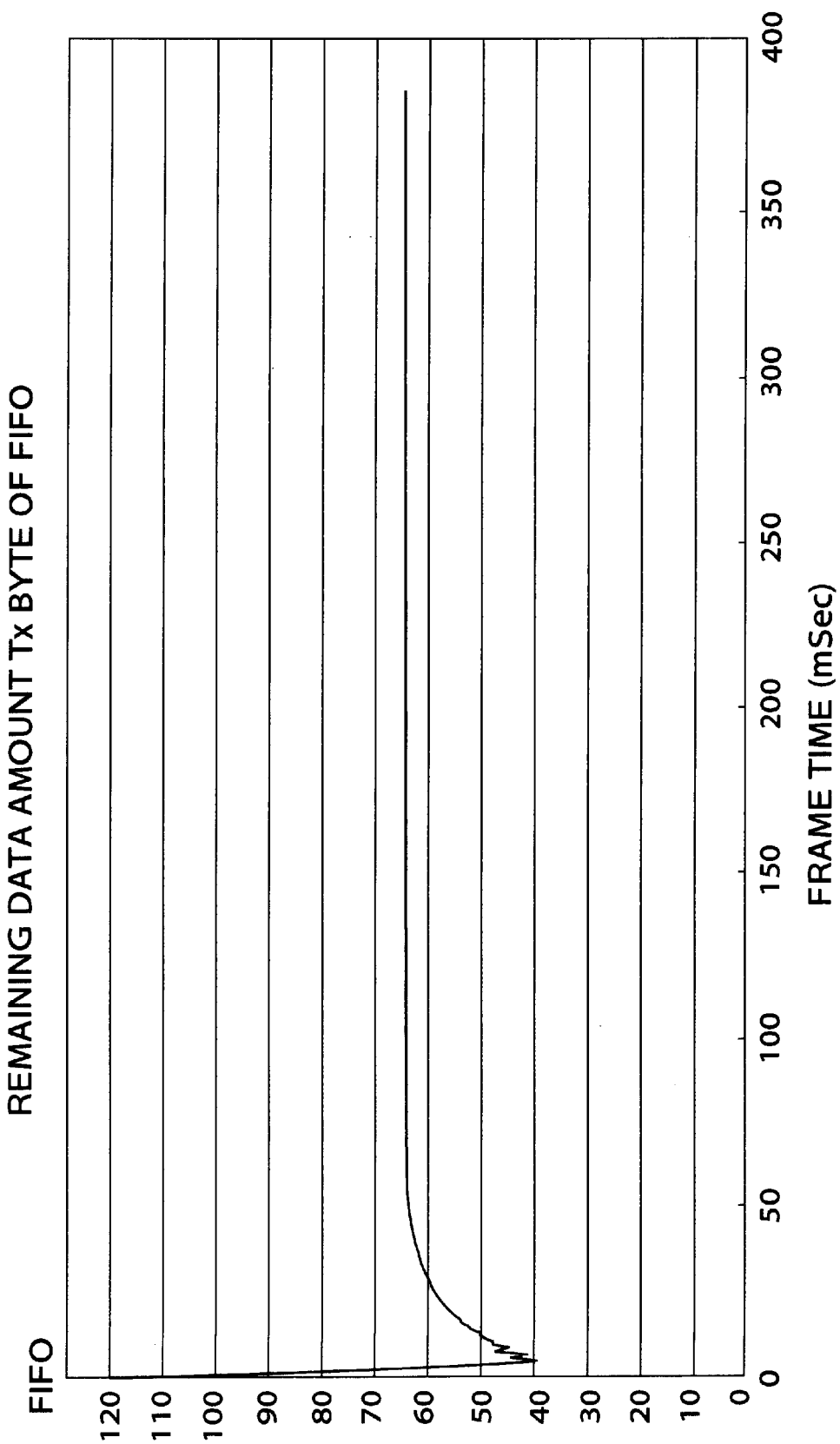

In the next step S13, the divider value PLLDIV[N] of the current cycle is calculated according to the expression (2) as follows:

$$\text{PLLDIV}[N] = \text{PLLDIV\_av}[N] + \text{Table}\,[\text{TxByte}-\text{CENTER}] \quad (2)$$

where Table [TxByte−CENTER] represents a value obtained from a table that represents a control variable determined based on a difference between the remaining data amount TxByte of the FIFO 11 and one half of the full capacity of the FIFO 11. As shown in FIG. 7, for example, the values or outputs of the table are set in advance in accordance with a desired response speed characteristic of the control system. In FIG. 7, straight line A indicates a linear relationship between the difference (TxByte−CENTER) as an input and the table value (control variable) as an output. To achieve a further improved response, curve B of the second order (quadratic curve) or curve C of the third order (cubic) may represent the relationship between the difference (TxByte−CENTER) and the control variable. Once the divider value PLLDIV[N] is calculated in the above manner, step S14 is executed to set this value to the 1/N divider 15, to thereby control the frequency divider ratio of the output clock signal of the external locked oscillator 16 to thus adjust the output frequency fs.

FIG. 8A through FIG. 10B illustrate response characteristics of the feedback system obtained when the value of #filter and the type (linear, quadratic, or cubic) of the table were changed. In one example of FIGS. 8A and 8B, the oscillation frequency of the external locked oscillator 16 was equal to 48 MHz, the value of the coefficient #filter was 4, and the control variable was obtained based on the linear relationship (line A) with the difference (TxByte−CENTER). In another example of FIGS. 9A and 9B, the oscillation frequency of the external locked oscillator 16 was equal to 48 MHz, the value of the coefficient #filter was 8, and the control variable was obtained based on the linear relationship (line A) with the difference (TxByte−CENTER). In a further example of FIGS. 10A and 10B, the oscillation frequency of the external locked oscillator 16 was equal to 48 MHz, the value of the coefficient #filter was 8, and the control variable was obtained based on the quadratic curve B. It will be understood from FIGS. 8A–9B that the period of delay is larger when the coefficient #filter is 8, compared to the case where it is 4, but it takes less time for the system having the coefficient #filter of 8 to reach the locked state. It will be also understood from FIGS. 9A–10B that the use of the quadratic curve rather than the linear relationship makes it significantly faster for the system to reach the locked state. In this connection, it was confirmed that the system oscillates without reaching the locked state where the filtering as described above is not carried out.

Once the divider value PLLDIV is set in step S14 of FIG. 6, the control flow goes to step S15 to execute a subroutine for detecting whether the system has been locked.

Figure 11:
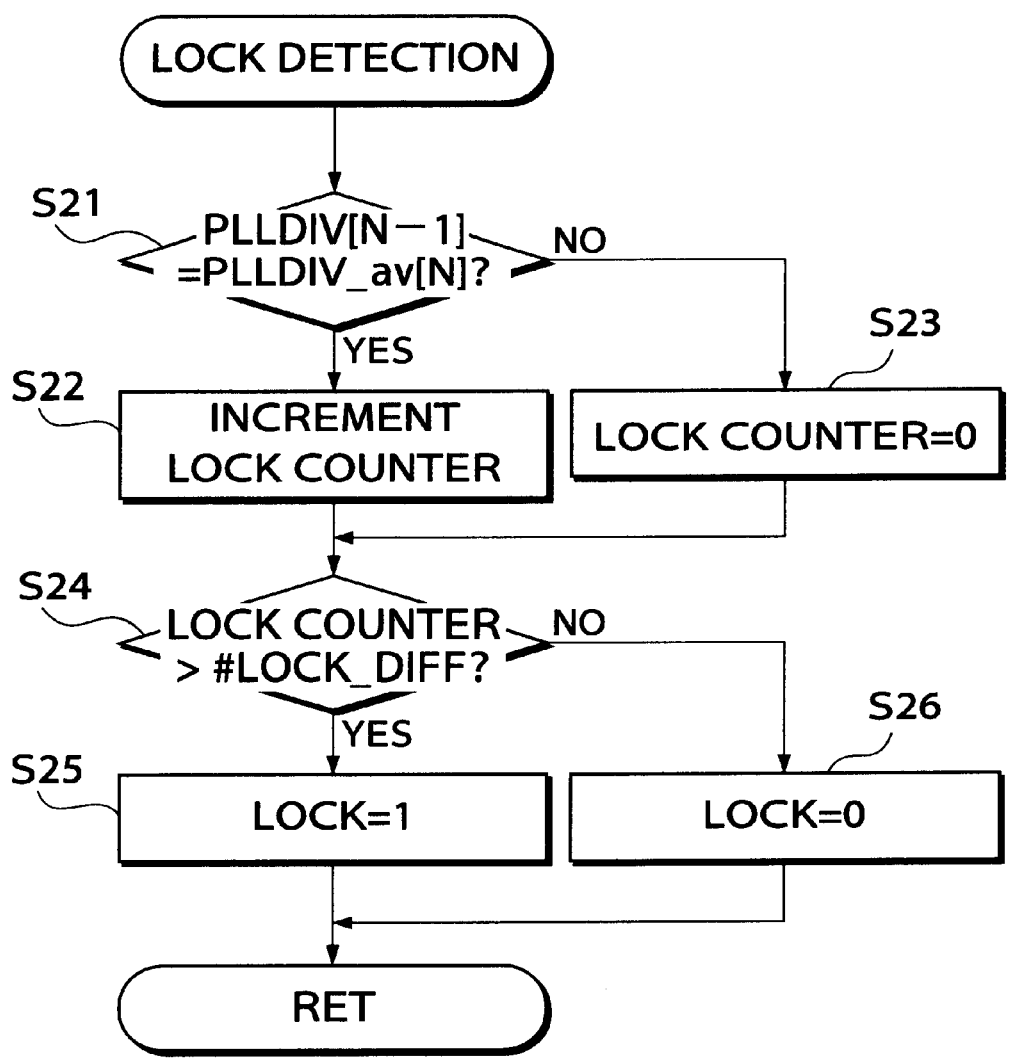
FIG. 11 is a flowchart showing a lock detecting routine executed in step S15 of the control routine of FIG. 6.

FIG. 11 shows the lock detecting subroutine in detail. Initially, step S21 is executed to check if the divider value PLLDIV[N−1] calculated in the last control cycle is equal to the running average value PLLDIV_av[N] of divider values obtained in the current cycle. If the divider value PLLDIV [N−1] is equal to the running average value PLLDIV_av [N], there is a high possibility that the PLL circuit is in the locked state, and therefore the value of a LOCK counter is incremented by 1 in step S22. If step S21 determines that the divider value PLLDIV[N−1] is not equal to the running average value PLLDIV_av[N], step S23 is executed to set the value of the LOCK counter to 0. Step S24 is then executed to determine whether the value of the LOCK counter is larger than a predetermined value #LOCK_DIFF. If the value of the LOCK counter is larger than the predetermined value #LOCK_DIFF, it is assumed that the divider value remains equal to the running average value for a predetermined period of time or longer, and step S25 is executed to set a flag LOCK to 1 that indicates the system is in the locked state. If step S24 determines that the value of the LOCK counter is equal to or smaller than the predetermined value #LOCK_DIFF, step S26 is executed to set the flag LOCK to 0 that indicates that the system is not in the locked state.

Returning to the flowchart of FIG. 6, step S16 is executed to determine whether the system is in the locked state or not. If an affirmative decision (YES) is obtained in step S16, namely, if the system is in the locked state, step S17 is executed to set a PLL mode flag to 1. If the system is in the unlocked state, on the other hand, the PLL mode flag remains 0, and the synchronizing operation in the "Run Ave SYNC" mode is repeated.

If the PLL circuit is locked and the PLL mode flag is set to 1, the control flow goes from step S1 to step S3 in FIG. 5, to perform a synchronizing operation in the "UP/DOWN SYNC" mode in response to an input of the SYNC signal.

Figure 12:
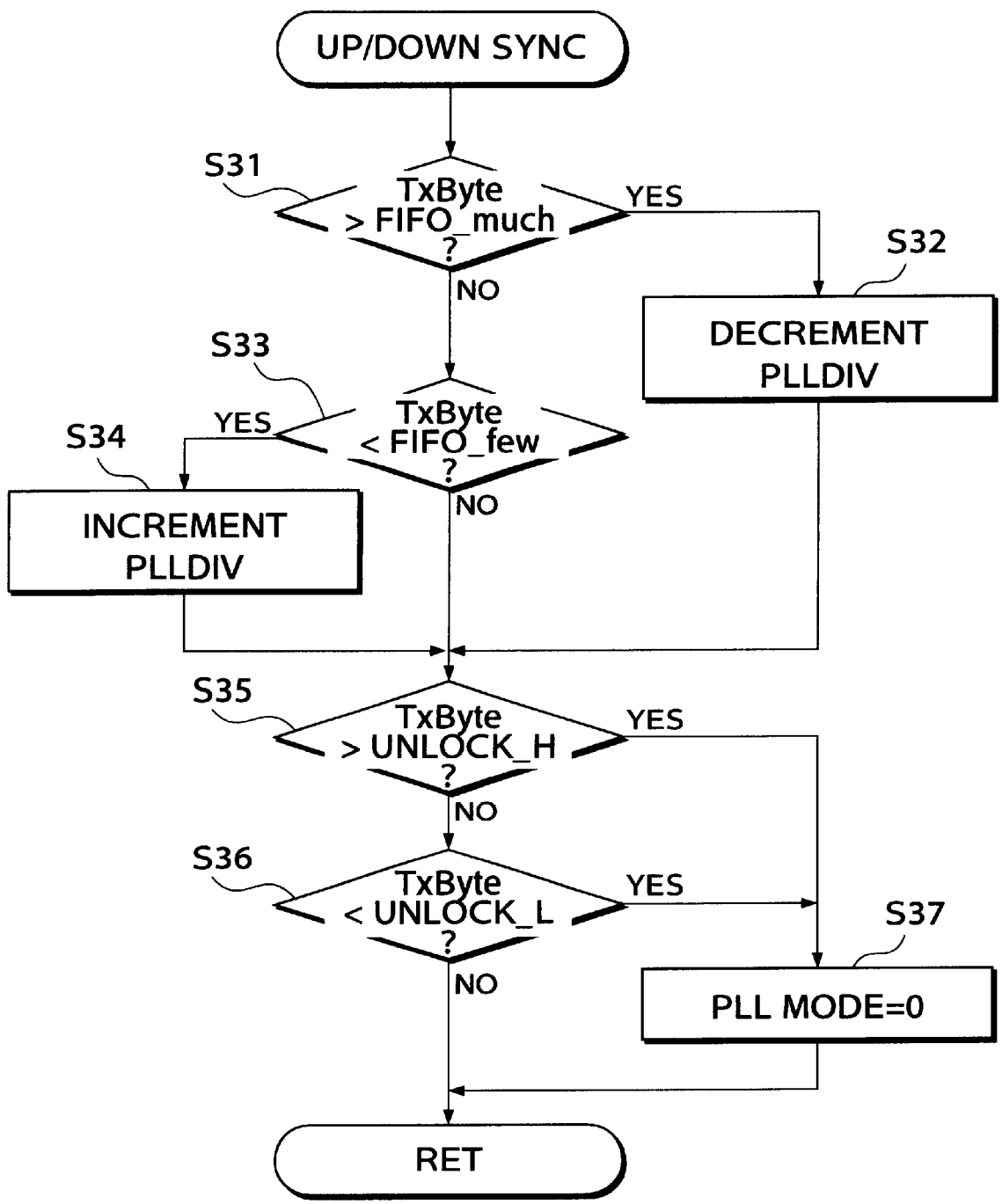
FIG. 12 is a flowchart showing a synchronizing operation performed in an "UP/DOWN SYNC" mode in step S3 of the routine of FIG. 5.

FIG. 12 shows the synchronizing operation performed in the "UP/DOWN SYNC" mode.

Initially, step S31 is executed to determine whether the remaining data amount of the FIFO 11 exceeds the preset value FIFO_much that defines the permissible fluctuation range as described above. If step S31 determines that the remaining data amount exceeds the preset value FIFO_much, step S32 is executed to decrement the divider value PLLDIV by 1, so as to increase the sampling frequency fs. If a negative decision (NO) is obtained in step S31, step S33 is executed to determine whether the remaining data amount of the FIFO 11 falls below the preset value FIFO_few that also defines the permissible fluctuation range. If step S33 determines that the remaining data amount falls below the preset value FIFO_few, step S34 is executed to increment the divider value PLLDIV by 1, so as to reduce the sampling frequency fs. Where step S35 determines that the remaining data amount TxByte is larger than the preset value UNLOCK_H, or step S36 determines that the remaining data amount TxByte is smaller than the preset value UNLOCK_L, the system is judged as coming out of the locked state. In this case, step S37 is executed to set the PLL mode flag to 0, and the routine of FIG. 12 is finished.

Figure 13A:
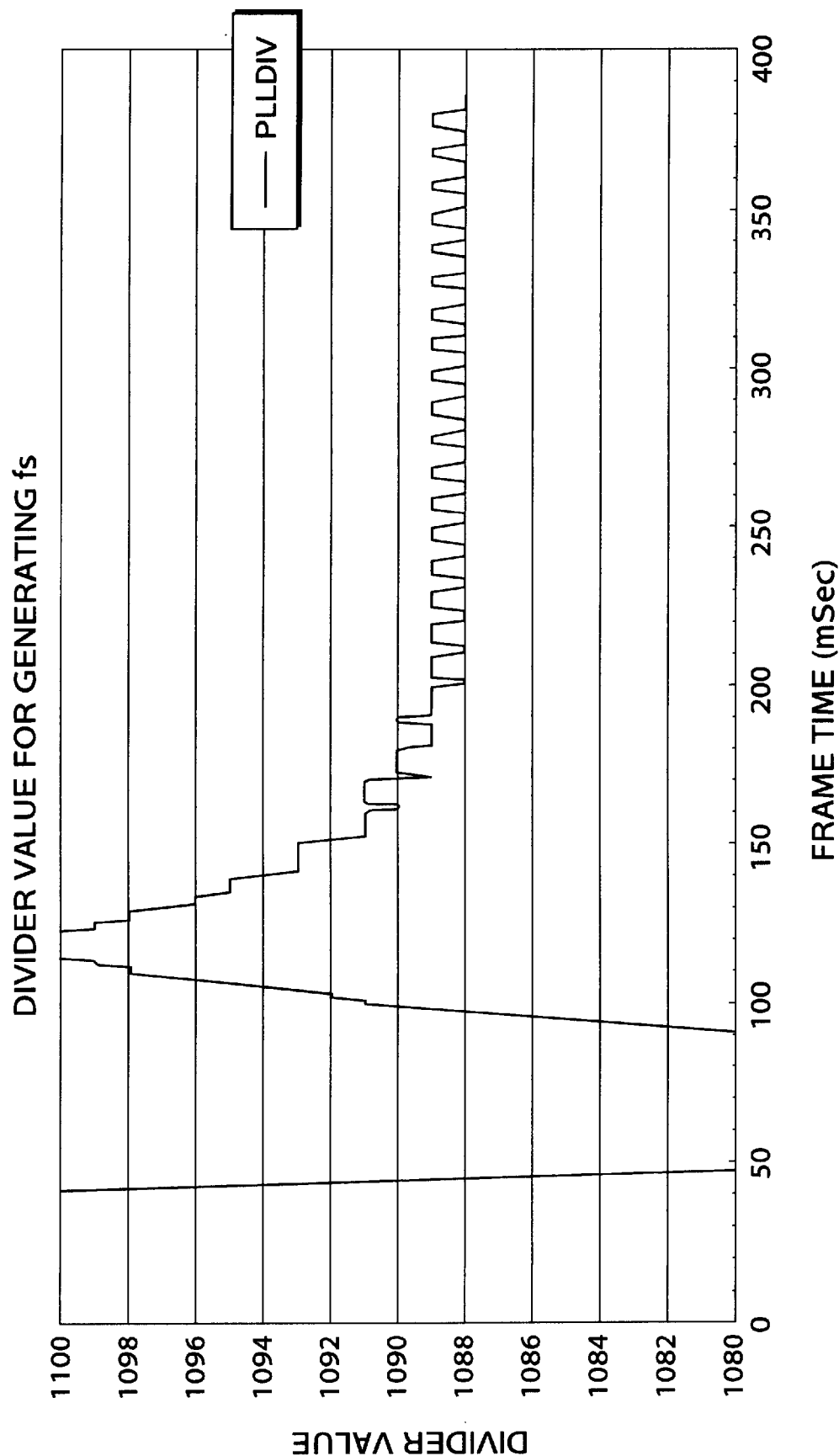
Figure 13B:
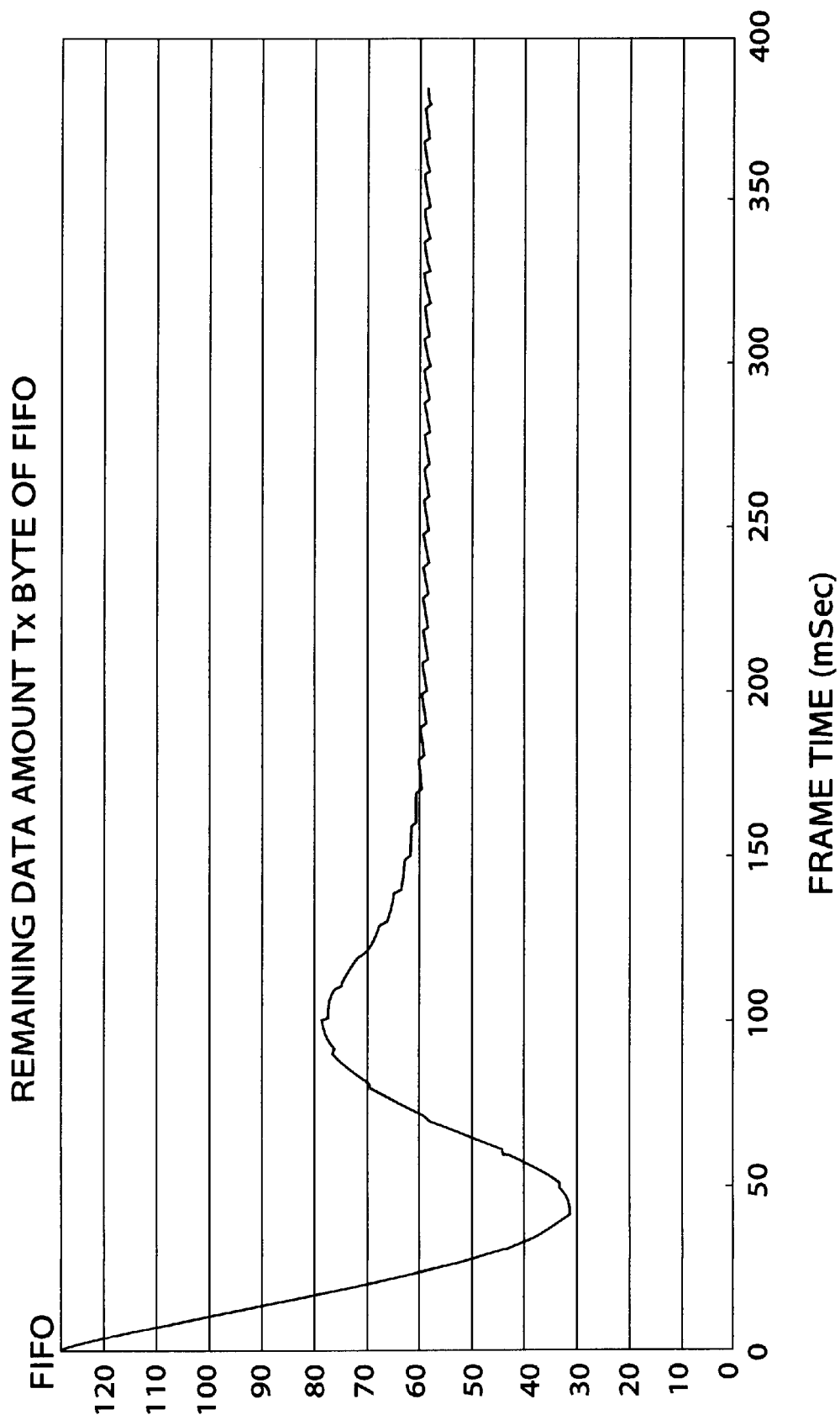

The synchronizing operation of the UP/DOWN SYNC mode as described above is characterized in that the permissible fluctuation range (dead zone) is provided between the preset values FIFO_few and FIFO_much, and no particular control is performed while the remaining data amount TxByte of the FIFO is held in this permissible fluctuation range. If such a dead zone is not provided, the divider value varies at a frequency of several hundreds of hertz (Hz) that is within the audible frequency band as shown in FIGS. 13A and 13B while the system is in the locked state, under the influence of jitter contained in the reproduced clock signal. If the permissible fluctuation range is provided for the remaining data amount TxByte of the FIFO, on the other hand, the varying frequency of the divider value can be reduced to several hertz (Hz) that is outside the audible frequency band, as shown in FIGS. 14A and 14B, thus assuring improved audio characteristics.

What is claimed is:

1. A synchronous control apparatus comprising:
   a digital variable-frequency oscillator having an output frequency thereof variable in dependence upon a frequency control variable;
   a data storage device that stores externally input data, and generates the data in accordance with an output of said digital variable-frequency oscillator; and
   a control device that controls the output frequency of the digital variable-frequency oscillator, by detecting a remaining data amount of said data storage device in response to an externally input timing signal that is received in synchronism with the data received by said data storage device such that synchronization is performed based on the timing signal, performing a filtering operation on values of the frequency control variable so as to calculate an average value of the frequency control variable, calculating a new value of the frequency control variable based on the calculated average value and a difference between the detected remaining data amount of the data storage device and a target data amount thereof, and controlling the output frequency of said digital variable-frequency oscillator based on the calculated new value of the frequency control variable so as to reduce a difference between the remaining data amount of the data storage device and the target data amount thereof.

2. The synchronous control apparatus according to claim 1, wherein said control device perform the filtering on a difference between a previous value of the frequency control variable and a previous average value of the frequency control variable, so as to calculate a current average value of the frequency control variable, and calculates the new value of the frequency control variable based on the current average value and the difference between the detected remaining data amount and the target data amount.

3. The synchronous control apparatus according to claim 1, wherein said control device determines an output value based on a curve of at least the second order that represents a relationship between the output value and the difference between the detected remaining data amount of the data storage device and the target data amount, and calculates the new value of the frequency control variable based on the calculated average value of the frequency control variable and the determined output value.

4. The synchronous control apparatus according to claim 1, wherein said control device includes an inhibiting device that inhibits the frequency control variable from being changed when the difference between the detected remaining data amount of the data storage device and the target data amount is within a predetermined permissible fluctuation range while the synchronous control circuit is in a locked state.

5. The synchronous control apparatus according to claim 1, wherein the target data amount is set to one half of a capacity of the data storage device.

6. A synchronous control method comprising the steps of:
   generating a sampling signal having a frequency thereof variable in dependence upon a frequency control variable;
   storing externally input data in a data storage device, and generating the data in accordance with the sampling signal;
   detecting a remaining data amount of the data storage device in response to an externally input timing signal that is received in synchronism with the data received by the data storage device such that synchronization is performed based on the timing signal;
   performing a filtering operation on values of the frequency control variable so as to calculate an average value of the frequency control variable;

calculating a new value of the frequency control variable based on the calculated average value and a difference between the detected remaining data amount of the data storage device and a target data amount thereof; and controlling the frequency of the sampling signal based on the calculated new value of the frequency control variable so as to reduce a difference between the remaining data amount of the data storage device and the target data amount thereof.

7. A synchronous control apparatus comprising:

oscillator means for outputting a-frequency varying according to a frequency control variable;

storage means for storing externally input data, and generating the data according to an output of said the oscillator means; and control means for controlling the output frequency of the oscillator means, by detecting a remaining data amount of said data storage device in response to an externally input timing signal that is received in synchronism with the data received by the storage means such that synchronization is performed based on the timing signal, performing a filtering operation on values of the frequency control variable so as to calculate an average value of the frequency control variable, calculating a new value of the frequency control variable based on the calculated average value and a difference between the detected remaining data amount of the data storage device and a target data amount thereof, and controlling the output frequency of the oscillator means based on the calculated new value of the frequency control variable so as to reduce a difference between the remaining data amount of the storage means and the target data amount thereof.

8. The synchronous control apparatus according to claim 7, wherein the control means performs the filtering operation based on a difference between a previous value of the frequency control variable and a previous average value of the frequency control variable, so as to calculate a current average value of the frequency control variable, and calculates the new value of the frequency control variable based on the current average value and the difference between the detected remaining data amount and the target data amount.

9. The synchronous control apparatus according to claim 7, wherein the control means determines an output value based on a curve of at least the second order that represents a relationship between the output value and the difference between the detected remaining data amount of the storage means and the target data amount, and calculates the new value of the frequency control variable based on the calculated average value of the frequency control variable and the determined output value.

10. The synchronous control apparatus according to claim 7, wherein the control means includes inhibiting means for inhibiting the frequency control variable from being changed when the difference between the detected remaining data amount of the storage means and the target data amount is within a predetermined permissible fluctuation range while the synchronous control apparatus is in a locked state.

11. A synchronous control apparatus according to claim 7, wherein the target data amount is set to one half of a capacity of the storage means.

12. A synchronous control method comprising the steps of:

generating a sampling signal having a frequency thereof variable in dependence upon a frequency control variable;

storing externally input data in a storage means, and generating the data in accordance with the sampling signal;

detecting a remaining data amount of the storage means in response to an externally input timing signal that is received in synchronism with the data received by the storage means such that synchronization is performed based on the timing signal;

performing a filtering operation on values of the frequency control variable so as to calculate an average value of the frequency control variable;

calculating a new value of the frequency control variable based on the calculated average value and a difference between the detected remaining data amount of the storage means and a target data amount thereof; and controlling the frequency of the sampling signal based on the calculated new value of the frequency control variable so as to reduce a difference between the remaining data amount of the storage means and the target data amount thereof.

13. An article comprising:

a storage medium having stored thereon instructions that when executed by a machine result in the following:

outputting an output frequency varying according to a frequency control variable;

storing externally input data, and generating the input data according to the output frequency;

controlling the output frequency by detecting a remaining input data amount in response to an externally input timing signal that is received in synchronism with the input data received such that synchronization is performed based on the timing signal;

performing a filtering operation on values of the frequency control variable so as to calculate an average value of the frequency control variable;

calculating a new value of the frequency control variable based on the calculated average value and a difference between the detected remaining input data amount and a target data amount thereof; and controlling the output frequency based on the calculated new value so as to reduce a difference between the remaining input data amount and the target data amount thereof.

14. The article according to claim 13, wherein the instructions further result in performing the filtering operation on a difference between a previous value of the frequency control variable and a previous average value of the frequency control variable, so as to calculate a current average value of the frequency control variable, and calculating the new value of the frequency control variable based on the current average value and the difference between the detected remaining input data amount and the target data amount.

15. The article according to claim 13, wherein the instructions further result in determining an output value based on a curve of at least second order that represents a relationship between the output value and the difference between the detected remaining input data amount and the target data amount, and calculating the new value of the frequency control variable based on the calculated average value of the frequency control variable and the determined output value.

16. The article according to claim 13, wherein the instructions further result in inhibiting the frequency control variable from being changed when the difference between the detected remaining input data amount and the target data amount is within a predetermined permissible fluctuation range while a synchronous control circuit is in a locked state.

17. The article according to claim 13, wherein the target data amount is set to one half of a capacity of a data storage device.

18. A synchronous control apparatus comprising:
- a digital variable frequency oscillator having an output frequency variable dependent upon a frequency control variable;
- a data storage device to store externally input data and generate the externally input data according to an output of the digital variable-frequency oscillator; and
- a control device to calculate the frequency control variable and control the digital variable-frequency oscillator based on the calculated frequency control variable, wherein the control device provides control so that:
  - a remaining data amount of the data storage device is detected as a monitored amount in response to an externally input timing signal received in synchronism with the externally input data received by the data storage device such that synchronism is performed based on the timing signal,
  - a present value of the frequency control variable is calculated based on a difference between the detected remaining data amount of the data storage device and a target data amount of the data storage device, and an output frequency of the digital variable-frequency oscillator is controlled based on a calculated new frequency control variable so as to reduce a difference between the detected remaining data amount and the target data amount of the data storage device,
  - before the synchronous control apparatus is locked, the present value of the frequency control variable is calculated using a running average value of the frequency control variable and a value obtained based on the detected remaining data amount of the data storage device and the target data amount, and whether the synchronous control apparatus is locked is detected by determining whether the running average value and a preceding value of the frequency control variable are equal, and
  - after the synchronous control apparatus is locked, the frequency control variable is inhibited from being changed when the difference between the detected remaining data amount and the target data amount is within a permissible fluctuation range set such that a varying frequency of the frequency control variable can be in a low frequency range that is outside an audible frequency band.

19. The synchronous control apparatus according to claim 18, wherein the control device terminates execution of the control when the difference between the detected remaining data amount and the target data amount falls outside a second permissible fluctuation range which is wider than the first-mentioned permissible fluctuation range.

20. The synchronous control apparatus according to claim 18, wherein the control device determines an output value based on a curve of at least a second order that represents a relationship between the output value and a different between the detected remaining data amount of the data storage device and the target data amount, and sets a present value of the frequency control variable to a sum of an average value of the frequency control value and the determined output value.

* * * * *